United States Patent
Farner et al.

(10) Patent No.: US 9,192,043 B2
(45) Date of Patent: Nov. 17, 2015

(54) PWB COOLING SYSTEM WITH HEAT DISSIPATION THROUGH POSTS

(71) Applicant: Hamilton Sundstrand Corporation, Charlotte, NC (US)

(72) Inventors: Rachel Farner, Springfield, MA (US); Jay W. Kokas, East Granby, CT (US); Kenneth J. Trotman, Granby, CT (US); Kerry R. Querns, Durham, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 105 days.

(21) Appl. No.: 13/932,699

(22) Filed: Jul. 1, 2013

(65) Prior Publication Data
US 2015/0000961 A1    Jan. 1, 2015

(51) Int. Cl.
H05K 1/02 (2006.01)
H05K 3/00 (2006.01)

(52) U.S. Cl.
CPC ............ *H05K 1/0209* (2013.01); *H05K 3/0061* (2013.01); *H05K 1/0204* (2013.01); *H05K 2201/10416* (2013.01); *H05K 2201/10553* (2013.01)

(58) Field of Classification Search
CPC .. H05K 1/0209; H05K 1/0203; H05K 3/0061
USPC ................................................ 174/252, 260
See application file for complete search history.

(56) References Cited

U.S. PATENT DOCUMENTS

| | | | |
|---|---|---|---|
| 6,802,362 B2 | 10/2004 | Wenger et al. | |
| 6,883,594 B2 | 4/2005 | Sarraf et al. | |
| 7,342,788 B2 | 3/2008 | Nikfar | |
| 7,405,937 B1 | 7/2008 | Wang et al. | |
| 7,493,939 B2 | 2/2009 | Xia et al. | |
| 7,885,075 B2 | 2/2011 | Li et al. | |
| 7,924,565 B2 | 4/2011 | Huang et al. | |
| 8,004,842 B2 | 8/2011 | Huang et al. | |
| 2004/0112570 A1 | 6/2004 | Wenger et al. | |
| 2008/0158820 A1 | 7/2008 | Peng et al. | |
| 2008/0296047 A1* | 12/2008 | Kaji | 174/252 |
| 2012/0085520 A1 | 4/2012 | Pfaffinger | |
| 2012/0170210 A1 | 7/2012 | Kim et al. | |
| 2013/0294025 A1 | 11/2013 | Davidson | |

FOREIGN PATENT DOCUMENTS

JP    H06181396 A    6/1994

OTHER PUBLICATIONS

Search Report, dated Oct. 2, 2014, for United Kingdom Patent Application No. 1407655.8, 3 pages.

* cited by examiner

*Primary Examiner* — Jeremy C Norris
(74) *Attorney, Agent, or Firm* — Kinney & Lange, P.A.

(57) ABSTRACT

An apparatus includes a printed wiring board, a post that supports the printed wiring board, and a heat pipe on the printed wiring board with a first end positioned near an electronic component attached to the printed wiring board and a second end positioned near the post.

20 Claims, 4 Drawing Sheets

PWB COOLING SYSTEM WITH HEAT DISSIPATION THROUGH POSTS

BACKGROUND

The present invention relates to a cooling apparatus for printed wiring boards.

Thermal management of aircraft mounted electronic components is becoming increasingly more challenging with the higher density of more powerful, but smaller electronic components. Currently, heat pipe embedded heat sinks have been used to move heat from a hot electronic component on a printed wiring board to cooler locations. Heat pipe embedded heat sinks have an inherent loss of efficiency in that the heat has to move from the electronic component, through the printed wiring board, to the heat sink, and then to a cooler location. This design is also severely limited in applications where there are electronic components on two sides of a printed wiring board. Further, the heat sink adds excessive weight and cost to the overall electronic assembly.

Due to space limitations on aircraft, printed wiring boards are typically stacked on top of one other and separated with posts. These posts are separate pieces that are attached to a printed wiring board and/or heat sink with screws. The posts support the printed wiring boards and create space between the printed wiring boards so that air can flow around the printed wiring boards. The posts can also be used to suspend a printed wiring board in a chassis that is mounted on an aircraft.

SUMMARY

An apparatus includes a printed wiring board, a post that supports the printed wiring board, and a heat pipe on the printed wiring board with a first end positioned near an electronic component attached to the printed wiring board and a second end positioned near the post.

An apparatus for cooling an electronic component on a printed wiring board includes a printed wiring board, an electronic component attached to the printed wiring board, a plurality of posts attached to the printed wiring board, and a heat pipe attached to the printed wiring board with a first end near the electronic component and a second end near one of the plurality of posts.

A method for cooling an electronic component on a printed wiring board includes absorbing heat into a first end of a heat pipe that is positioned on a printed wiring board from an electronic component on the printed wiring board, transferring the heat through the heat pipe, and releasing the heat at a second end of the heat pipe into a post supporting the printed wiring board.

DETAILED DESCRIPTION

In general, the present invention relates to transferring heat from an electronic component to a post using a heat pipe. With advancements in technology, more powerful electronic components are being used in aircraft applications. These electronic components tend to be higher heat generating electronic components, so more effective heat dissipating arrangements are needed to cool these components. The present application discloses multiple arrangements where heat can be transferred from a high heat generating electronic component on a printed wiring board through a heat pipe to a post that supports the printed wiring board. The post can then dispel the heat into an ambient, thus cooling the overall electronic assembly.

Figure 1:
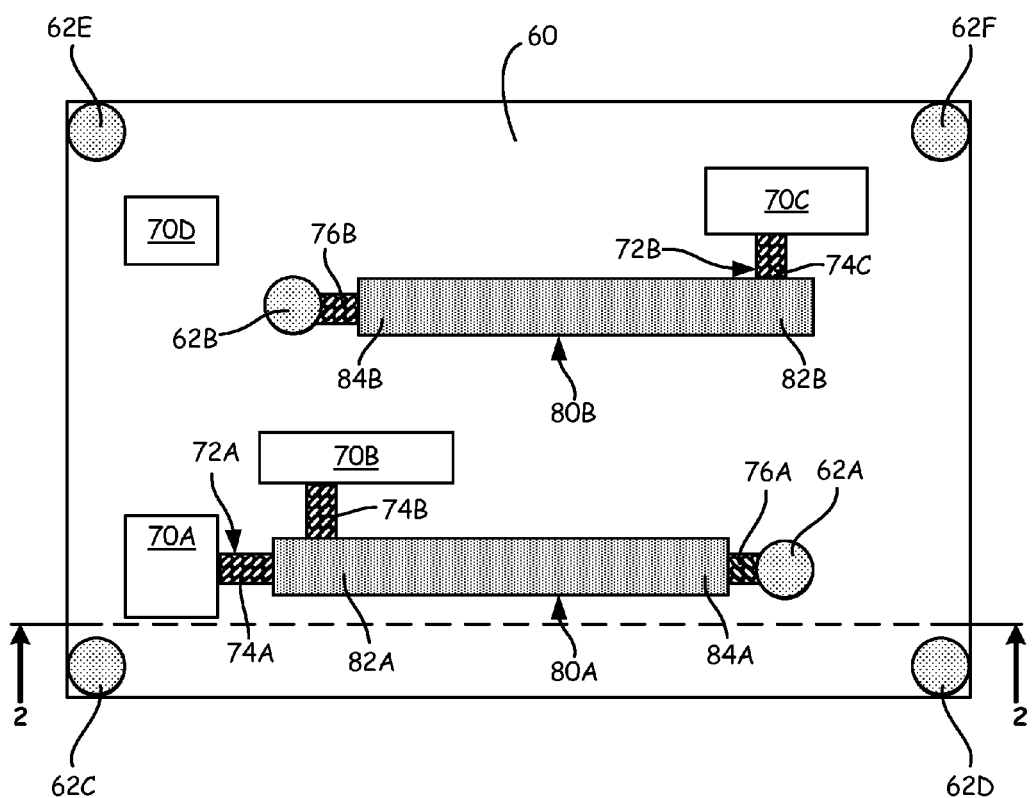
FIG. 1 is a top plan view of a first embodiment of a printed wiring board with a heat pipe.

FIG. 1 is a top plan view of a first embodiment of printed wiring board 60 with heat pipes 80. Printed wiring board 60 includes posts 62 (including post 62A, post 62B, post 62C, post 62D, post 62E, and post 62F), electronic components 70 (including electronic component 70A, electronic component 70B, electronic component 70C, and electronic component 70D), copper traces 72 (including copper trace 72A and copper trace 72B), and heat pipes 80 (including heat pipe 80A and heat pipe 80B). Each copper trace 72 has at least one electronic component connecting end 74 and post connecting end 76. Copper trace 72A has electronic component connecting end 74A, electronic component connecting end 74B, and post connecting end 76A. Copper trace 72B has electronic component connecting end 74C and post connecting end 76B. Each heat pipe 80 has first end 82 and second end 84. Heat pipe 80A has first end 82A and second end 84A. Heat pipe 80B has first end 82B and second end 84B.

Printed wiring board 60 can be any board that is capable of holding electronic components 70 on a top side of printed wiring board 60. Printed wiring board 60 can be constructed with any suitable size and weight. In the embodiment shown in FIG. 1, four electronic components 70A-70D are positioned on printed wiring board 60. In alternate embodiments, the number and position of electronic components 70 on printed wiring board 60 can vary. Posts 62 are attached to a bottom side of printed wiring board 60 with fasteners extending up through printed wiring board 60 to the top side of printed wiring board 60. In the embodiment shown in FIG. 1, six posts 62A-62F are positioned on printed wiring board 60. In alternate embodiments, the number and position of posts 62 on printed wiring board 60 can vary.

Heat pipes 80 are also positioned on the top side of printed wiring board 60. Heat pipes 80 are soldered to printed wiring board 60 along copper traces 72 in the embodiment shown, but can be connected to printed wiring board 60 with any suitable means in alternate embodiments, including bonding, welding or pressing. Heat pipes 80 include first ends 82 positioned near electronic components 70 and second ends 84 positioned near posts 62. In the embodiment shown in FIG. 1, two heat pipes 80A and 80B are positioned on printed wiring board 60. First end 82A of heat pipe 80A is positioned near electronic component 70A and electronic component 70B. Second end 84A of heat pipe 80A is positioned near post 62A. First end 82B of heat pipe 80B is positioned near electronic component 70C. Second end 84B of heat pipe 80B is positioned near post 62B. In alternate embodiments, the number and position of heat pipes 80 can vary. Further, the number of electronic components 70 that are positioned near first ends 82 of heat pipes 80 can vary. In the embodiment shown in FIG. 1, one second end 84 of one heat pipe 80 ends at one post 62. In alternate embodiments, the number of second ends 84 of heat pipes 80 that end at one post 62 can vary.

Heat pipe 80 includes a hollow housing. The housing can contain a working fluid that is capable of two-phase heat transfer and a wick material on interior surfaces of the housing to wick the working fluid from second ends 84 of heat pipes 80 to first ends 82 of heat pipes 80. Heat from electronic components 70 will enter heat pipes 80 at first end 82, causing the working fluid to vaporize. The vaporized working fluid can then be transferred through heat pipe 80. The vaporized working fluid can release the heat into post 62 at second end 84, causing the working fluid to condense. The wick material can then transfer the condensed working fluid back to first end 82. Heat pipes 80 can be constructed out of any suitable materials, including any suitable housing material, any suitable working fluid, and any suitable wick material. Heat pipes 80 can be shaped and sized to fit in any arrangement on printed wiring board 60. This includes flattening heat pipes 80 to fit on printed wiring board 60 if desired.

Copper traces 72 are positioned on the top side of printed wiring board 60 to run between electronic components 70 and posts 62. Copper traces 72 each include at least one electronic component connecting end 74 and post connecting end 76. Electronic component connecting ends 74 of copper traces 72 are positioned between electronic components 70 and heat pipes 80 to direct the heat generated by electronic components 70 to first ends 82 of heat pipes 80. Post connecting ends 76 are positioned between heat pipes 80 and posts 62 to direct the heat from second ends 84 of heat pipes 80 into posts 62.

The size, shape, and placement of copper traces 72 can vary. In the embodiment shown in FIG. 1, copper trace 72A has electronic component connecting end 74A positioned between electronic component 70A and first end 82A of heat pipe 80A to transfer heat from electronic component 70A to heat pipe 80A. Copper trace 72A also has electronic component connecting end 74B positioned between electronic component 70B and first end 82A of heat pipe 80A to transfer heat from electronic component 70B to heat pipe 80A. Copper trace 72A also has post connecting end 76A positioned between second end 84A of heat pipe 80A and post 62A to transfer heat from heat pipe 80A to post 62A. Copper trace 72B has electronic component connecting end 74C positioned between electronic component 70C and first end 82B of heat pipe 80B to transfer heat from electronic component 70C to heat pipe 80B. Copper trace 72B also has post connecting end 76B positioned between second end 84B of heat pipe 80B and post 62B to transfer heat from heat pipe 80B to post 62B. Copper traces 72 can be added to printed wiring board 60 when printed wiring board 60 is manufactured using any suitable manufacturing process.

Placing heat pipes 80 directly on printed wiring board 60 is advantageous, as it more effectively transfers heat from electronic components 70 to heat pipes 80. It is further advantageous, as a heat sink does not have to be used in combination with the printed wiring board 60 to effectively transfer heat from printed wiring board 60 to an ambient. Eliminating the need to use a heat sink is advantageous, as it reduces the overall weight of the printed wiring board assembly and reduces the cost of procuring and storing a heat sink and the time needed to assemble a printed wiring board assembly with a heat sink. Further, when a heat sink is used to cool printed wiring board 60 it is placed against one side of printed wiring board 60. Printed wiring boards 60 can hold electronic components 70 on both sides, but when a heat sink is used in connection with printed wiring board 60, the space on which electronic components 70 can be placed is severely limited. By placing heat pipe 80 directly on printed wiring board 60, the need to use a heat sink to cool printed wiring board 60 is eliminated, which provides more space on printed wiring board 60 where electronic components 70 can be placed.

Placing heat pipes 80 between electronic components 70 and posts 62 is further advantageous, as it more effectively transfers heat from the electronic components to an ambient. Previously used models that utilize a heat sink to transfer heat from electronic components 70 to an ambient have an inherent loss of thermal efficiency between printed wiring board 60 and the heat sink. Placing heat pipes 80 on printed wiring board 60 more efficiently transfers heat from electronic components 70 to posts 62, as there is no thermal energy lost between printed wiring board 60 and the heat sink. Further, placing heat pipe 80 directly on printed wiring board 60 allows the heat to be evened out on printed wiring board 60.

Positioning heat pipes 80 between electronic components 70 and posts 62 is also advantageous, as dissipating heat through posts 62 will more effectively cool printed wiring board 60. Posts 62 can be attached to printed wiring board 60 to provide a thermal path along which heat can dissipate. Dispelling heat from posts 62 into an ambient more efficiently cools printed wiring board 60 over previously used models. Having more effective cooling allows higher heat generating and more powerful electronic components 70 to be used. This allows flexibility in the design of printed wiring board 60 and allows more effective and reliable electronic components 70 to be used.

Figure 2:
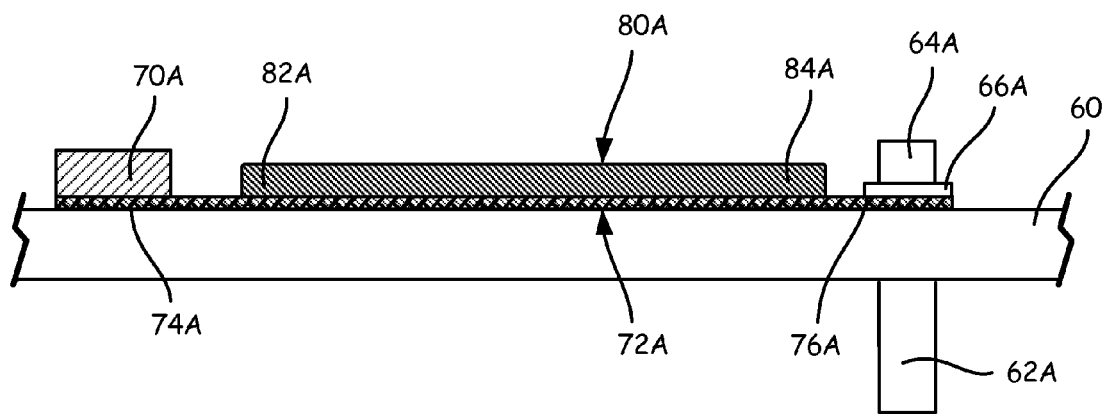
FIG. 2 is a cross-sectional view of the first embodiment of the printed wiring board, taken along line 2-2 of FIG. 1.

FIG. 2 is a cross-sectional view of the first embodiment of printed wiring board 60, taken along line 2-2 of FIG. 1. Printed wiring board 60 includes post 62A, fastener 64A, washer 66A, electronic component 70A, copper trace 72A, and heat pipe 80A. Copper trace 72A has electronic component connecting end 74A and post connecting end 76A. Heat pipe 80A includes first end 82A and second end 84A.

Printed wiring board 60 is supported by post 62A. Post 62A is attached to a bottom side of printed wiring board 60 with fastener 64A and washer 66A. Fastener 64A is placed through washer 66A, printed wiring board 60, and into post 62A. Electronic component 70A is positioned on a top side of printed wiring board 60.

Heat pipe 80A is also positioned on the top side of printed wiring board 60. First end 82A of heat pipe 80A is positioned near electronic component 70A and second end 84A of heat pipe 80A is positioned near post 62A. Also positioned on the top side of printed wiring board 60 is copper trace 72A. Copper trace 72A runs between heat pipe 80A and printed wiring board 60 and also between electronic component 70A and printed wiring board 60. Copper trace 62A allows electronic component 70A and heat pipe 80A to be soldered to printed wiring board 60 in the embodiment shown, but in alternate embodiments electronic component 70A and heat pipe 80A can be attached to printed wiring board 60 using any suitable means.

Copper trace 72A has electronic component connecting end 74A and post connecting end 76A. Electronic component connecting end 74A of copper trace 72A is positioned between electronic component 70A and first end 82A of heat pipe 80A to transfer heat from electronic component 70A to first end 82A of heat pipe 80A. Electronic component connecting end 74A extends underneath electronic component 70A to effectively absorb heat generated by electronic component 70A. With this arrangement, heat pipe 80A will absorb heat from electronic component 70A at first end 82A via electronic component connecting end 74A of copper trace 72A. The heat will then be transferred through heat pipe 80A with phase-change heat transfer. The heat can then be released from second end 84A of heat pipe 80A into post 62A via post connecting end 76A of copper trace 72A. Post connecting end 76A of copper trace 72A is positioned between second end 84A of heat pipe 80A and post 62A. Post connecting end 76A of copper trace 72A extends underneath washer 66A to effectively released heat from heat pipe 80A into post 62A. The heat can then be dissipated through post 62A into an ambient.

Using electronic component connecting end 74A of copper trace 72A to transfer heat from electronic component 70A to first end 82A of heat pipe 80A is advantageous, as it provides a pathway through which the heat can travel to direct the heat to first end 82A of heat pipe 80A. Using post connecting end 76A of copper trace 72A to transfer heat from second end 84A of heat pipe 80A to post 62A is also advantageous, as it provides a pathway through which the heat can travel to direct the heat to post 62A. Copper has high thermal conductive properties, thus heat will tend to transfer through copper trace 72A versus dissipating into surrounding areas on printed wiring board 60. This will increase the effectiveness of the overall thermal energy transfer, as heat from electronic component 70A will transfer through copper trace 72A into first end 82A of heat pipe 80A instead of other areas of printed wiring board 60. Likewise, heat from second end 84A of heat pipe 80A will transfer through copper trace 72A into post 62A instead of other areas of printed wiring board 60. This prevents printed wiring board 60 from getting too hot and provides a better cooling pathway for electronic component 70A through printed wiring board 60 and post 62A into an ambient.

Transferring heat from electronic component 70A through heat pipe 80A to post 62A is advantageous, as it allows for more efficient heat transfer through printed wiring board 60 and into an ambient. Post 62A provides a thermal pathway through which heat can be transferred from electronic component 70A to an ambient. Using post 62A to dispel heat from printed wiring board 60 to an ambient provides for more efficient cooling of printed wiring board 60. Having more efficient cooling of printed wiring board 60 allows higher heat generating and more powerful electronic components 70 to be used on printed wiring board 60. This provides greater flexibility in the design of printed wiring board 60 and allows more effective and reliable electronic components 70 to be used. These electronic components 70 tend to be smaller in size and weight than previously used electronic components, making then advantageous for use in aircraft applications. Reducing the overall weight of an aircraft is advantageous, as it allows for greater efficiency of the aircraft.

Further, attaching heat pipe 80A directly to printed wiring board 60 is advantageous in aircraft applications, as heat pipe 80A will be able to survive in harsh aircraft engine mount environments. This creates greater flexibility in where printed wiring board 60 can be mounted. Attaching heat pipe 80A directly to printed wiring board 60 also reduces material procurement costs, inventory costs, and assembly costs. Heat pipes that were used in previous aircraft applications required thermal pads and other additional parts to accommodate for vibration and tolerance. Attaching heat pipe 80A directly to printed wiring board 60 eliminates the need for additional parts, which eliminates the cost and time associated with procuring and storing these parts. It also reduces the cost and time required to assemble the overall printed wiring board assembly.

Figure 3:
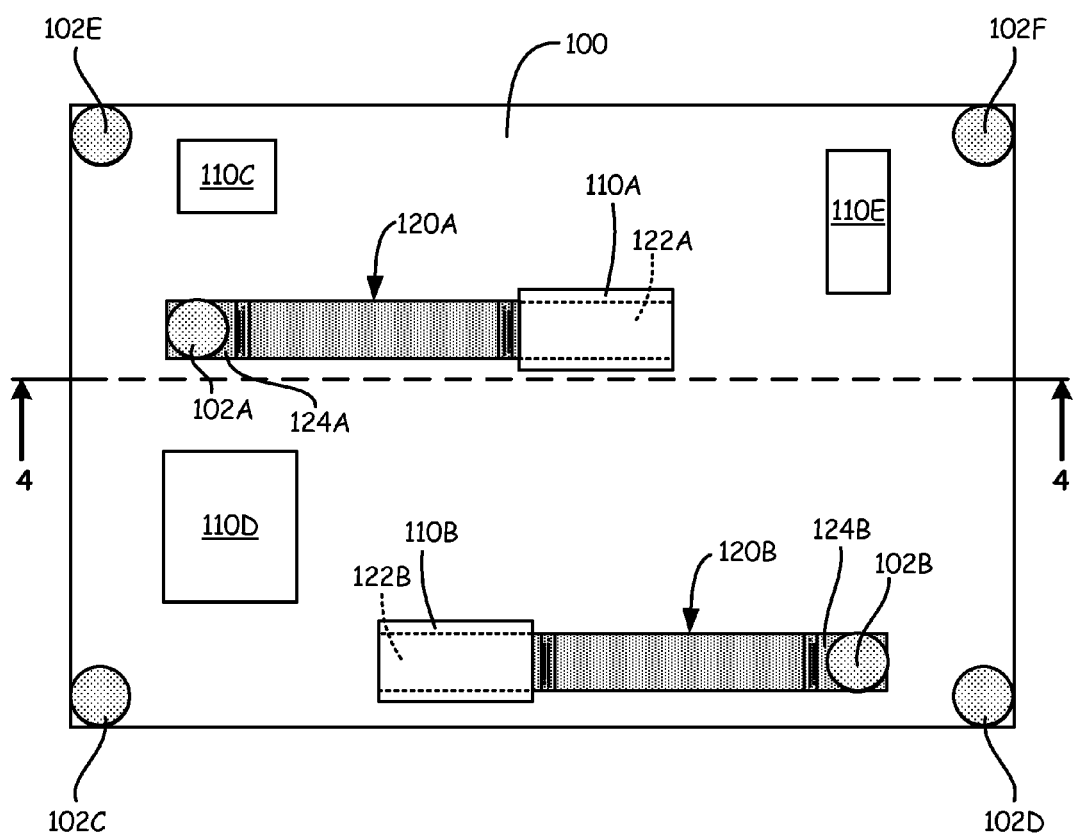
FIG. 3 is a top plan view of a second embodiment of a printed wiring board with a heat pipe.

FIG. 3 is a top plan view of a second embodiment of printed wiring board 100 with heat pipes 120. Printed wiring board 100 includes posts 102 (including post 102A, post 102B, post 102C, post 102D, post 102E, and post 102F), electronic components 110 (including electronic component 110A, electronic component 110B, electronic component 110C, electronic component 110D, and electronic component 110E), and heat pipes 120 (including heat pipe 120A and heat pipe 120B). Each heat pipe 120 has first end 122 and second end 124. Heat pipe 120A has first end 122A and second end 124A. Heat pipe 120B has first end 122B and second end 124B.

Printed wiring board 100 can be any board that is capable of holding electronic components 110 on a top side or a bottom side of printed wiring board 100. In the embodiment shown in FIG. 3, five electronic components 110A-110E are positioned on a top side of printed wiring board 100. In alternate embodiments, the number and position of electronic components 110 on printed wiring board 100 can vary. Posts 102 are attached to a bottom side of printed wiring board 100 with fasteners extending up through printed wiring board 100 to the top side of printed wiring board 100. In the embodiment shown in FIG. 3, six posts 102A-102F are positioned on printed wiring board 100. In alternate embodiments, the number and position of posts 102 on printed wiring board 100 can vary.

Heat pipes 120 are also positioned on the top side of printed wiring board 100. Heat pipes 120 include first ends 122 and second ends 124, each of which are flattened. The ends of heat pipes 120 are flattened so that they can be positioned to more effectively transfer heat across printed wiring board 100. First ends 122 and second ends 124 can be flattened by clamping them while heat pipes 120 are being manufactured, or by any other suitable means that will flattened the ends of heat pipes 120. First ends 122 of heat pipes 120 should be sized to fit underneath electronic components 110. Second ends 124 of heat pipes 120 should be similarly sized to posts 122 and have an aperture running through them so that they can be mounted to post 122. The aperture can be drilled into second end 124 of heat pipe 120 after heat pipe 120 is manufactured, or by any other suitable means that can create an aperture through second end 124 of heat pipe 120.

Heat pipes 120 includes a hollow housing. The hollow housing can contain a working fluid that is capable of two-phase heat transfer and a wick material on interior surfaces of the housing to wick the working fluid from second ends 124 of heat pipes 120 to first ends 122 of heat pipes 120. The working fluid in heat pipe 120 runs does not extend into flattened first end 122 or flattened second end 124 of heat pipe 120, but rather runs through a center portion of heat pipe 120 that is not flattened. Heat from electronic components 110 will enter heat pipes 120 at first end 122, causing the working fluid to vaporize. The vaporized working fluid can then be transferred through heat pipe 120. The vaporized working fluid can release the heat into post 102 at second end 124, causing the working fluid to condense. The wick material can then transfer the condensed working fluid back to first end 122. Heat pipes 120 can be constructed out of any suitable materials, including any suitable housing material, any suitable working fluid, and any suitable wick material. Heat pipes 120 can be shaped and sized to fit in any arrangement on printed wiring board 100.

Heat pipes 120 are added to printed wiring board 100 during assembly of printed wiring board 100. First ends 122 of heat pipes 120 are positioned under electronic components 110, and second ends 124 of heat pipes 120 are mounted to posts 102. Heat pipe 120 can be held on printed wiring board 100 by positioning it in this arrangement on printed wiring board 100, or it can be further attached to printed wiring board 100 with any suitable manufacturing process, including bonding, welding, pressing, or soldering. In the embodiment shown in FIG. 3, two heat pipes 120A and 120B are positioned on printed wiring board 100. Flattened first end 122A of heat pipe 120A is positioned underneath electronic component 110A. Second end 124A of heat pipe 120A is mounted to post 102A. First end 122B of heat pipe 120B is positioned underneath electronic component 110B. Second end 124B of heat pipe 120B is mounted to post 102B. In alternate embodiments, the number and position of heat pipes 120 can vary. Further, the number of electronic components that are positioned near first ends 122 of heat pipes 120 can vary.

Placing first ends 122 of heat pipes 120 underneath electronic components 110 and mounting second ends 124 of heat pipes 120 to posts 102 is advantageous, as it more effectively transfer heat away from electronic components 110 to an ambient. Transferring heat through posts 102 is advantageous, as it provides a thermal pathway along which heat from printed wiring board 100 can be transferred to an ambient. This arrangement allows for more efficient heat transfer and more effective cooling of printed wiring board 100. Having more effective cooling of printed wiring board 100 allows higher heat generating and more powerful electronic components 110 to be used on printed wiring board 100. Being able to use more powerful electronic components 110 on printed wiring board 100 allows for greater flexibility in the design of printed wiring board 100 and allows more effective and reliable electronic components 110 to be used.

Mounting second ends 124 of heat pipes 120 to posts 102 is also advantageous, as it provides for more efficient energy transfer through posts 102. Previously used arrangements that have a heat pipe ending near post 102 have a gap between an end of the heat pipe and post 102. These arrangements have an inherent thermal resistance at the interface between the end of the heat pipe and post 102 where the heat has to transfer through the gap. Mounting second ends 124 of heat pipes 120 to posts 102 eliminates the thermal resistance and provides for more efficient heat transfer from second end 124 of heat pipe 120 to post 102. Having more efficient heat transfer allows printed wiring board 100 to be used in higher temperature environments, as printed wiring board 100 can be more efficiently cooled.

The cost and time to assemble the overall printed wiring board assembly is also decreased, as no additional parts are needed to cool printed wiring board 100. Some previously used applications used a heat sink to cool printed wiring board 100, which adds weight and cost to the printed wiring board assembly. Other previously used applications would mount a heat pipe to a printed wiring board using thermal pads and other additional parts. The thermal pads and other parts are not needed when heat pipe 120 is attached directly to printed wiring board 100. Overall, the cost and time to procure, store, manufacture, and assemble these additional parts are eliminated.

Figure 4:
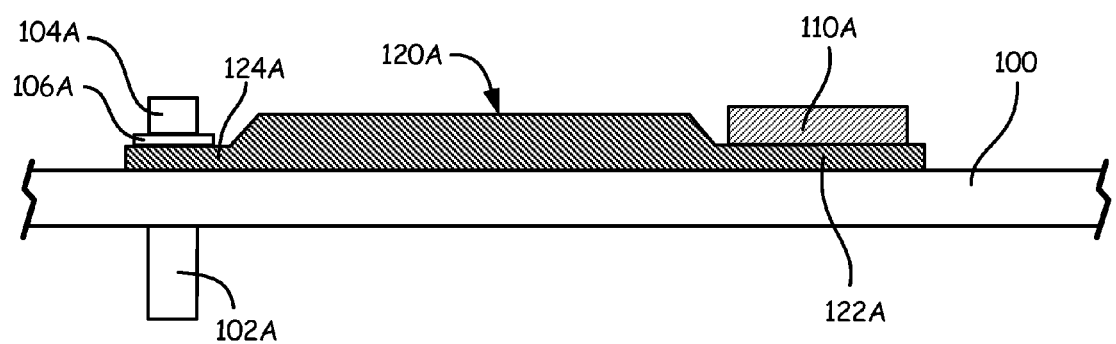
FIG. 4 is a cross-sectional view of the second embodiment of the printed wiring board taken along line 4-4 of FIG. 3.

FIG. 4 is a cross-sectional view of the second embodiment of printed wiring board 100 taken along line 4-4 of FIG. 3. Printed wiring board 100 includes post 102A, fastener 104A, washer 106A, electronic component 110A, and heat pipe 120A. Heat pipe 120A includes first end 122A and second end 124A.

Printed wiring board 100 is capable of holding electronic component 110A and heat pipe 120A. Heat pipe 120A is positioned on a top side of printed wiring board 100. First end 122A of heat pipe 120A is flattened during manufacturing so that first end 122A of heat pipe 120A can be placed between electronic component 110A and printed wiring board 100. Second end 124A of heat pipe 120A is also flattened during manufacturing and an aperture is manufactured into second end 124A of heat pipe 120A so that second end 124A of heat pipe 120A can be mounted to post 102A on printed wiring board 100. Heat pipe 120A can be attached to printed wiring board 100 with any suitable means, including soldering or bonding.

Post 102A is held on printed wiring board 100 by placing fastener 104A the aperture in second end 124A of heat pipe 120A and into post 102A. In effect, fastener 104A also holds second end 124A of heat pipe 120A in place on printed wiring board 100, as it passes through second end 124A of heat pipe 120A. When fully inserted, fastener 104A runs through washer 106A, second end 124A of heat pipe 120A, printed wiring board 100, and into post 102A.

With this arrangement, heat pipe 120A will absorb heat from electronic component 110A at first end 122A. The heat will then be transferred through heat pipe 120A with phase-change heat transfer. The heat can then be released from second end 124A of heat pipe 120A into post 102A and transferred into an ambient.

This arrangement of heat pipe 120A on printed wiring board 100 is advantageous, as it allows for more efficient and effective heat transfer. Heat can be transferred from electronic component 110A through heat pipe 120A to post 102A, which will dispel the heat into an ambient. This arrangement more efficiently transfer heat through printed wiring board 100, which allows for better cooling of printed wiring board 100. Having better cooling of printed wiring board 100 allows higher heat generating and more powerful electronic components 110 to be used on printed wiring board 100.

Mounting second end 124A of heat pipe 120A directly to post 102A is also advantageous, as it eliminates the thermal resistance that previously existed between second end 124A of heat pipe 120A and post 102A. Eliminating the thermal resistance provides for more efficient heat transfer through printed wiring board 100. Having more efficient heat transfer allows printed wiring board 100 to be used in higher temperature environments on an aircraft. This allows for greater flexibility in the design of printed wiring board 100 and allows printed wiring board 100 to be placed in more locations on the aircraft.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An apparatus comprising:
 a printed wiring board;
 a post that supports the printed wiring board; and
 a heat pipe on the printed wiring board with a first end positioned near an electronic component attached to the printed wiring board and a second end positioned near the post.

2. The apparatus of claim 1, wherein the first end of the heat pipe is positioned to absorb heat from the electronic component.

3. The apparatus of claim 1, wherein the second end of the heat pipe is positioned to release heat into the post.

4. The apparatus of claim 1, wherein the heat pipe is soldered, bonded, or pressed onto the printed wiring board.

5. The apparatus of claim 1, wherein the first end of the heat pipe is positioned a first distance from the electronic component.

6. The apparatus of claim 5, and further comprising:
 a copper trace connecting the electronic component to the first end of the heat pipe.

7. The apparatus of claim 1, wherein the second end of the heat pipe is positioned a second distance from the post.

8. The apparatus of claim 1, wherein the first end of the heat pipe is flattened to fit between the electronic component and the printed wiring board.

9. The apparatus of claim 1, wherein the second end of the heat pipe is flattened and has an aperture to be mounted to the post with a fastener running through the aperture.

10. The apparatus of claim 1, wherein the first end and the second end of the heat pipe are flattened by clamping them during manufacturing.

11. An apparatus for cooling an electronic component on a printed wiring board comprising:
   a printed wiring board;
   an electronic component attached to the printed wiring board;
   a plurality of posts attached to the printed wiring board; and
   a heat pipe attached to the printed wiring board with a first end near the electronic component and a second end near one of the plurality of posts.

12. The apparatus of claim 11, wherein the first end of the heat pipe is positioned to absorb heat from the electronic component, a phase-change heat transfer is used to transfer the heat through the heat pipe, and the second end of the heat pipe is positioned to release the heat into one of the plurality of posts.

13. The apparatus of claim 11, wherein a copper trace is positioned between the electronic component and the first end of the heat pipe.

14. The apparatus of claim 11, wherein a first end of the heat pipe is flattened and positioned underneath the electronic component.

15. The apparatus of claim 11, wherein a second end of the heat pipe is flattened and has an aperture through which the heat pipe is mounted to the post with a fastener.

16. A method for cooling an electronic component on a printed wiring board comprising:
   absorbing heat into a first end of a heat pipe that is positioned on a printed wiring board from an electronic component on the printed wiring board;
   transferring the heat through the heat pipe; and
   releasing the heat at a second end of the heat pipe into a post supporting the printed wiring board.

17. The method of claim 16, wherein the heat pipe transfers heat with phase-change heat transfer.

18. The method of claim 16, and further comprising:
   transferring heat from the electronic component through a copper trace on the printed wiring board to the first end of the heat pipe.

19. The method of claim 16, wherein the first end of the heat pipe is flattened and positioned between the electronic component and the printed wiring board.

20. The method of claim 16, wherein the second end of the heat pipe is flattened and has an aperture so that it can be mounted to the post with a fastener running through the aperture.

* * * * *